(12) United States Patent
Sumino

(10) Patent No.: US 9,728,722 B2
(45) Date of Patent: Aug. 8, 2017

(54) SOCKET STRUCTURE FOR THREE-DIMENSIONAL MEMORY

(71) Applicant: Sony Corporation, Tokyo (JP)

(72) Inventor: Jun Sumino, Boise, ID (US)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/342,819

(22) Filed: Nov. 3, 2016

(65) Prior Publication Data

US 2017/0077399 A1  Mar. 16, 2017

Related U.S. Application Data

(62) Division of application No. 14/695,835, filed on Apr. 24, 2015, now Pat. No. 9,515,125.

(51) Int. Cl.
| | | |
|---|---|---|
| *H01L 27/115* | (2017.01) | |
| *H01L 45/00* | (2006.01) | |
| *H01L 27/24* | (2006.01) | |
| *H01L 21/768* | (2006.01) | |
| *H01L 23/522* | (2006.01) | |

(52) U.S. Cl.
CPC ............ *H01L 45/16* (2013.01); *H01L 21/768* (2013.01); *H01L 23/5226* (2013.01); *H01L 27/2481* (2013.01)

(58) Field of Classification Search
CPC ....... H01L 2924/0002; H01L 27/11582; H01L 2924/00; H01L 27/11556; H01L 27/11578; H01L 27/0688
USPC .................................. 257/2, 5, 314, E21.209
See application file for complete search history.

(56) References Cited

U.S. PATENT DOCUMENTS

| | | | | |
|---|---|---|---|---|
| 8,394,716 | B2 * | 3/2013 | Hwang | ............. H01L 27/11551 257/315 |
| 2007/0252201 | A1 | 11/2007 | Kito et al. | |
| 2009/0230449 | A1 * | 9/2009 | Sakaguchi | .......... H01L 27/0688 257/298 |
| 2014/0003114 | A1 * | 1/2014 | Pellizzer | ............. H01L 27/2481 365/63 |

FOREIGN PATENT DOCUMENTS

EP  1434258  6/2004

OTHER PUBLICATIONS

International Search Report for International (PCT) Patent Application No. PCT/JP2016/002025 mailed Aug. 30, 2016, 6 pages.

* cited by examiner

*Primary Examiner* — David Vu
*Assistant Examiner* — Jonathan Han
(74) *Attorney, Agent, or Firm* — Sheridan Ross P.C.

(57) ABSTRACT

Socket structures that are configured to use area efficiently, and methods for providing socket regions that use area efficiently, are provided. The staircase type contact area or socket region includes dielectric layers between adjacent planar electrodes that partially cover a portion of a planar electrode that does directly underlie an adjacent planar electrode. The portion of a dielectric layer between adjacent planar electrodes can be sloped, such that it extends from an edge of an overlying planar electrode to a point between the edge of an underlying planar electrode and a point corresponding to an edge of the overlying planar electrode.

4 Claims, 7 Drawing Sheets

SOCKET STRUCTURE FOR THREE-DIMENSIONAL MEMORY

CROSS REFERENCE TO RELATED APPLICATION

This application is a divisional application and claims the benefit of U.S. patent application Ser. No. 14/695,835, filed Apr. 24, 2015, the entire disclosure of which is incorporated herein by reference.

FIELD

The present disclosure relates to socket configurations for three-dimensional memories, and in particular to improving the area efficiency of sockets for three-dimensional memories.

BACKGROUND

Memory devices are used in a wide range of fields. For example, solid-state memory can be used for long or short term storage of program instructions and data in connection with computing devices. Memory density, access speed, and reliability are all important considerations in designing solid-state memory. Recent solid-state memory designs have used three-dimensional architectures. Such designs can increase memory density. In addition, such designs are well suited for use in connection with resistive random access memory (ReRAM), and phase-change random access memory (PCRAM or PRAM).

In a three-dimensional (3D) memory structure, signal lines, including bit lines (BL) and word lines (WL), extend between socket regions on a periphery of the memory structure, and the memory array itself. More particularly, a first socket region on a first side of the memory array can include electrodes or contacts associated with the bit lines, and a second socket region on a second side of the memory array can include electrodes or contacts associated with the word lines. In other configurations, socket regions on first and second opposing sides of the memory array can be associated with bit lines, and socket regions on third and fourth opposing sides of the memory array can be associated with word lines. As the number of memory cells included in the memory array is increased, there is a corresponding increase in the number of signal lines (i.e. bit lines and/or word lines). In addition, due to physical constraints in the size of the bit lines and word lines, the area of the memory structure occupied by the socket regions becomes increasingly large as compared to an area of the memory array. This problem is exacerbated by decreases in the size of memory cells and in the size of memory cell pitch, and increases in the density of the memory array.

The area of the memory structure occupied by socket regions also increases relative to the area of the memory structure occupied by the memory array as the number of decks or layers within the memory structure increases. More particularly, in a conventional socket arrangement, different decks or layers, corresponding to different horizontal electrodes, are disposed in a staircase type arrangement. These different layers are accessed by vertical conductors. As a result, the size of the socket area must be increased in order to accommodate an increased number of horizontal electrodes. That is, the number of "stairs" in the "staircase" must be increased, which for a given electrode contact size results in a proportional increase in the length of the socket region in a direction extending away from the memory array. In addition, the size of a contact established between a horizontal electrode and a vertical conductor is constrained by various factors. For example, a minimum contact area needs to be maintained in order to provide a suitable electrical contact and thus a suitably low electrical resistance. In addition, the ability to align a vertical conductor with a desired contact area can be limited by manufacturing tolerances, thus requiring some minimum contact area margin. Therefore, the proportion of the total area occupied by connection or socket regions tends to become increasingly large as memory cell area density increases.

Because of such problems, decreases in the overall size of memory structures have not kept pace with decreases in the size of memory arrays themselves, and costs associated with providing three-dimensional memory structures have remained relatively high.

SUMMARY

In three-dimensional memory structures, memory cells can be densely packed within the memory array. However, as the number of memory cells within a given area increases, the proportion of the overall area of the memory structure that is occupied by socket regions, rather than by memory cells, increases.

Embodiments of the present disclosure provide socket structures for three-dimensional memories that are configured to efficiently provide connections to memory cells within the memory array. In a solid state memory device, individual memory cells are accessed by selectively energizing bit lines and word lines. Bit lines and word lines are accessed through the bit line socket region or regions and word line socket region or regions respectively. For a given wiring dimension, as the number of bit lines and word lines increases, the area of the bit line socket region or word line socket region also increases. Embodiments of the present disclosure provide for a socket region comprising a staircase contact region that requires less area than in a conventional arrangement otherwise configured similarly. More particularly, by providing for dielectric or insulating layers between adjacent horizontal electrodes disposed in a staircase arrangement, in which the dielectric layers extend to a point between an end of an overlaying horizontal electrode and an end of an underlying horizontal electrode, a length factor dependent on a number of decks or horizontal electrodes can be decreased as compared to the conventional configuration.

A staircase type contact arrangement in accordance with embodiments of the present disclosure allows for an alignment margin applied to connecting conductors to be reduced as compared to conventional arrangements. Moreover, embodiments of the present disclosure allow contacts to electrically connect to both a top surface and an edge surface of a horizontal electrode. As a result, electrical performance, such as suitably low electrical resistance, can be maintained, even while the contact area available on a top surface of the horizontal electrodes is reduced as compared to conventional configurations.

In accordance with at least some embodiments of the present disclosure, the edge of the dielectric layers interposed between adjacent horizontal or planar electrodes is sloped. For example, a top of the edge of a dielectric layer can extend from a point corresponding to an edge of a first horizontal electrode to a point on a second horizontal electrode that is between an edge of the second horizontal electrode and a point on the second horizontal electrode in a first dimension equal to the furthest extent of the first electrode in the first dimension.

Methods in accordance with embodiments of the present disclosure provide a staircase type contact arrangement that allows the corresponding socket region to have a reduced area as compared to a staircase contact configured according to conventional arrangements. According to such methods, a pullback process is used to successively reveal planar electrodes as steps in a staircase. Dielectric layers disposed between adjacent planar electrodes are etched such that at least a portion of an edge of each dielectric layer lies in an area between an edge of an underlying horizontal electrode and an edge of an overlying horizontal electrode. In accordance with at least some embodiments, the edge of each dielectric layer is sloped. Methods in accordance with embodiments of the present disclosure can additionally include providing connecting conductors that contact both a portion of a top surface of an electrode and a portion of an edge surface of the electrode.

In accordance with at least some embodiments, a socket structure is provided for a three-dimensional memory with a memory array volume that extends in x, y, and z dimensions, and that includes a plurality of memory cells. A socket region is located along one side of the memory array volume such that it extends along the one side of the memory volume in the x dimension, and extends from the memory array volume in the y dimension. The memory structure further includes a plurality of dielectric layers that lie in planes extending in the x and y dimensions, and a plurality of horizontal electrodes that also lie in planes extending in the x and y dimensions. Adjacent horizontal electrodes included in the plurality of horizontal electrodes are separated from one another in the z dimension by at least one of the dielectric layers included in the plurality of dielectric layers. In addition, moving in at least a first direction along the z dimension, the horizontal electrodes extend from the memory array area to the first socket region by a greater amount, forming a staircase structure. An edge of a dielectric layer disposed between a first horizontal electrode and a second horizontal electrode is located between an edge of the first horizontal electrode and an edge of the second horizontal electrode. Within the first socket region, each horizontal electrode of the plurality of horizontal electrodes includes a portion that is not covered by a dielectric layer such that each of the horizontal electrodes is accessible along one more lines that are parallel to the z dimension.

In accordance with further embodiments, a socket region is provided. The socket region includes a plurality of insulating layers and a plurality of planar electrodes that are separated from one another by at least one of the insulating layers. Each of the planar electrodes extends for a different distance within the socket region, such that a portion of each planar electrode forms a step. A portion of an end surface of each insulating layer is located between the end surfaces of the adjacent planar electrodes.

In accordance with still other embodiments a method for forming a staircase contact socket region is provided. The method comprises providing a stack having a plurality of planar electrodes and a plurality of insulating layers, in which adjacent planar electrodes are separated from one another by an insulating layer. A mask is placed on the stack, and a first portion of a first insulating layer not under the mask is etched to expose a first portion of a first planar electrode in the plurality of planar electrodes. The mask is then pulled back. The method further includes pulling back the mask, etching a second portion of the first insulating layer, etching the first portion of the first planar electrode, and etching a first portion of a second insulating layer. The edge of the second insulating layer formed by the etching is sloped and extends from an edge of the first planar electrode to between the edge of the first planar electrode and an edge of the second planar electrode.

Additional features and advantages of embodiments of the present disclosure will become more readily apparent from the following description, particularly when taken together with the accompanying drawings.

DETAILED DESCRIPTION

Figure 1:
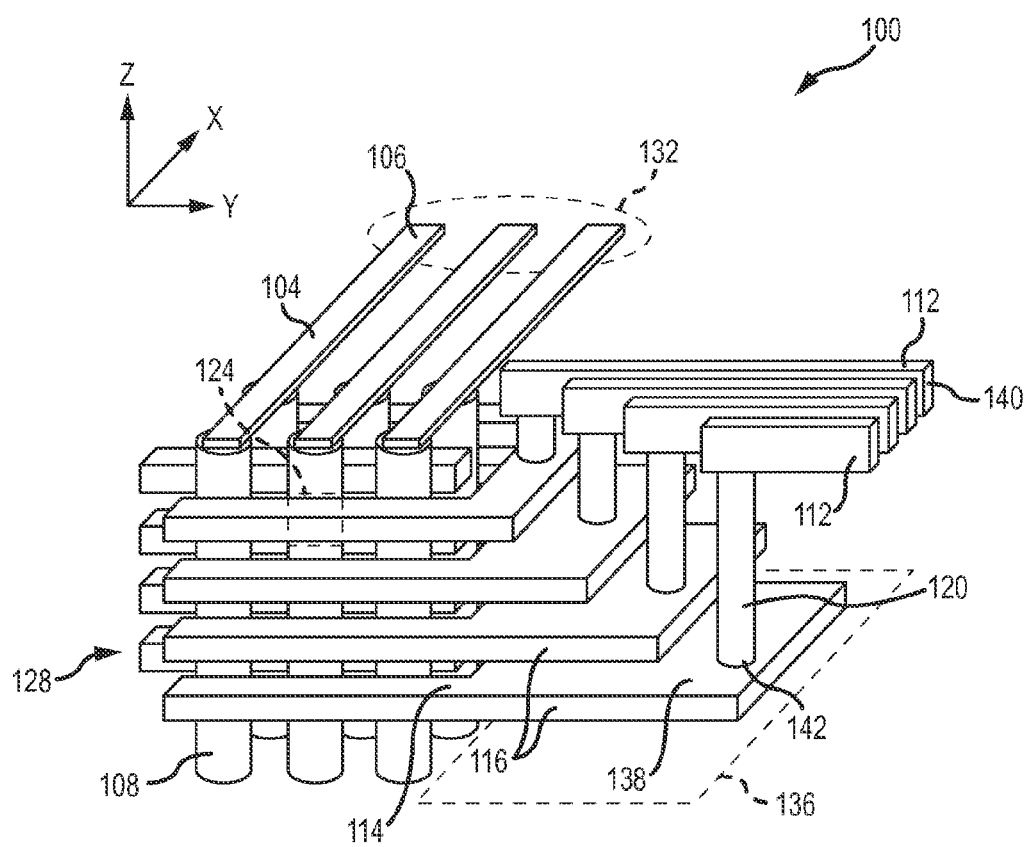
FIG. 1 is a perspective view of an exemplary three-dimensional memory structure.

FIG. 1 depicts an example three-dimensional memory structure 100. More particularly, a three-dimensional memory structure 100 in the form of a vertical memory array is depicted. The memory structure 100 includes a plurality of bit lines 104 that are electrically connected to the ends of vertical memory elements 108. The memory structure 100 also includes a plurality of word lines 112 and a plurality of horizontal or planar electrodes 116. Each word line 112 is connected to a top surface 114 of a horizontal electrode or deck 116, either directly or through a connecting conductor 120. The horizontal electrodes 116 are generally disposed within planes extending in the x and y dimensions. Memory cells 124 are formed in areas of the vertical memory elements 108 that are adjacent a horizontal electrode 116, and are generally contained within a memory array 128 of the memory structure. Moreover, the memory array 128 is contained within a volume that extends in three dimensions (x, y, z).

In the example memory structure 100, the bit lines 104 extend such that they can be accessed within a bit line socket region 132 adjacent one side of the memory array area 128. In accordance with other embodiments, the bit lines 104 can extend to opposite sides of the memory array area 128, such that two bit line socket regions 132 are provided. The number of bit line contacts or bits 106 that can be accessed within the bit line socket region 132 is, in this example, equal to the number of bit lines 104. Similarly, word lines 112 extend from a word line socket region 136 adjacent a side of the memory array area 128. In accordance with other embodiments, word line socket regions 136 can be provided on additional sides of the memory array 128. The number of word line contacts or bits 140 is, in this example, equal to the number of bit lines 112. The area encompassed by the word line socket region 136 is shown as a projection, as the connecting portions 138 of the horizontal electrodes 116 electrically connected to a connecting conductor 120 at a contact 142 are disposed in a staircase type arrangement, in which the connecting portions 138 of the different horizontal electrodes or decks 116 are disposed at different distances from the memory array area 128.

As the number of memory cells 124 within the memory structure 100 increases, the number of bit lines 108 and/or word lines 112 also increases. In this example, the number of word lines 112 is greater than the number of bit lines 104, which generally supports a high density memory array area 128, by allowing for an increased number of horizontal electrodes or decks 116. Moreover, while a three-dimensional memory structure, such as the example prior art memory structure 100, has memory cells 124 disposed in three-dimensions, the bit line 132 and word line 136 socket regions require a certain amount of area within a plane parallel to the horizontal electrodes 116 in which to complete the connections. The result is that, as the number of memory cells 124 increases, and in particular as the number of horizontal electrodes or decks 116 increases, the proportion of the total area of the memory structure occupied by the bit line 132 and word line 136 socket regions becomes increasingly large.

Figure 2:
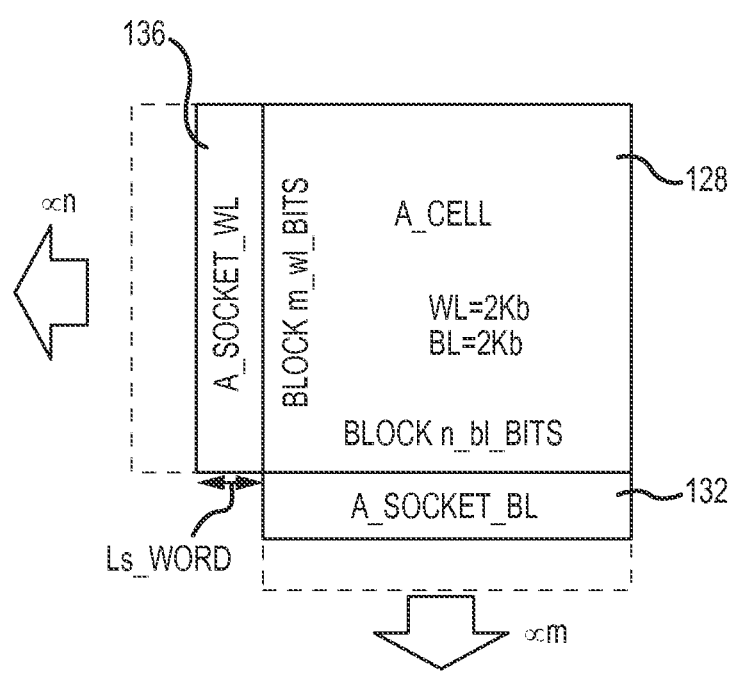
FIG. 2 depicts areas of a three dimensional memory structure in plan view.

As depicted in FIG. 2, the length $L_{s\_word}$ of the word line socket region 136 increases as the number (n) of horizontal electrodes 116 increases, in order to provide the connecting conductors 120 access to the horizontal electrodes 116, which are disposed in a staircase contact arrangement. Therefore, as the number of decks or horizontal electrodes 116 is increased, the area density of the memory array 128 increases, and the area occupied by the word line socket region or regions 136 also increases. Similarly, as the number (m) of bit lines 104 increases, the area occupied by the bit line socket region or regions 132 increases. In addition, for a given socket region 132, 136 arrangement, the overall area of a memory structure 100 occupied by the socket regions 132, 136 becomes increasingly large as the number of decks 116, and thus the number of memory cells 124 within a given memory cell area 128, increases. Moreover, the area occupied by the socket regions 132, 136 becomes an increasingly large proportion of the total area of the memory structure 100 as the density of the memory cell area 128 is increased. As can be appreciated by one of skill in the art after consideration of the present disclosure, the decrease in area efficiency occurs regardless of the number of socket regions 132, 136 included in the vertical memory structure.

Figure 3:
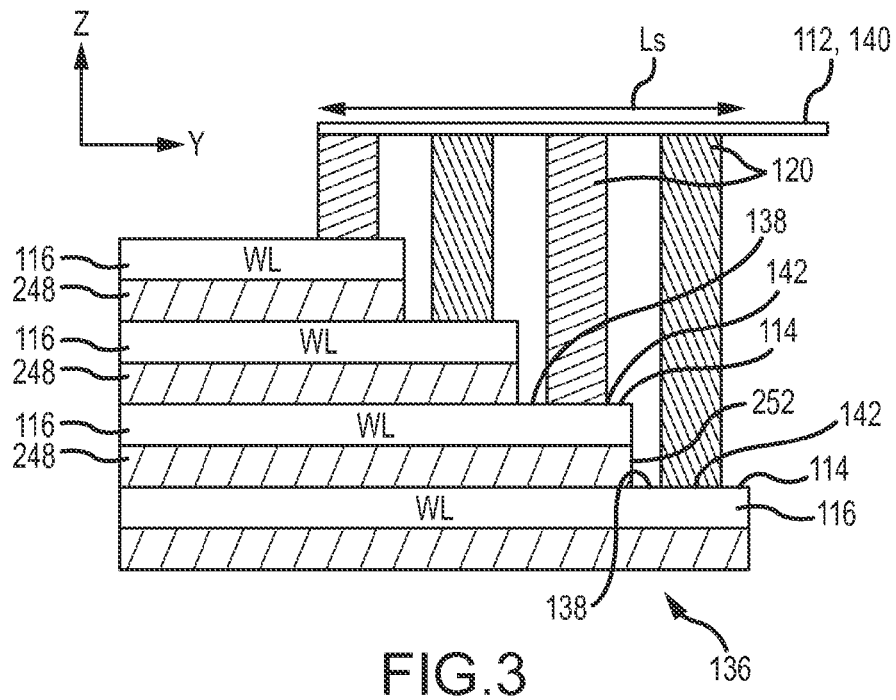
FIG. 3 depicts a prior art three dimensional memory structure in elevation.
Figure 4:
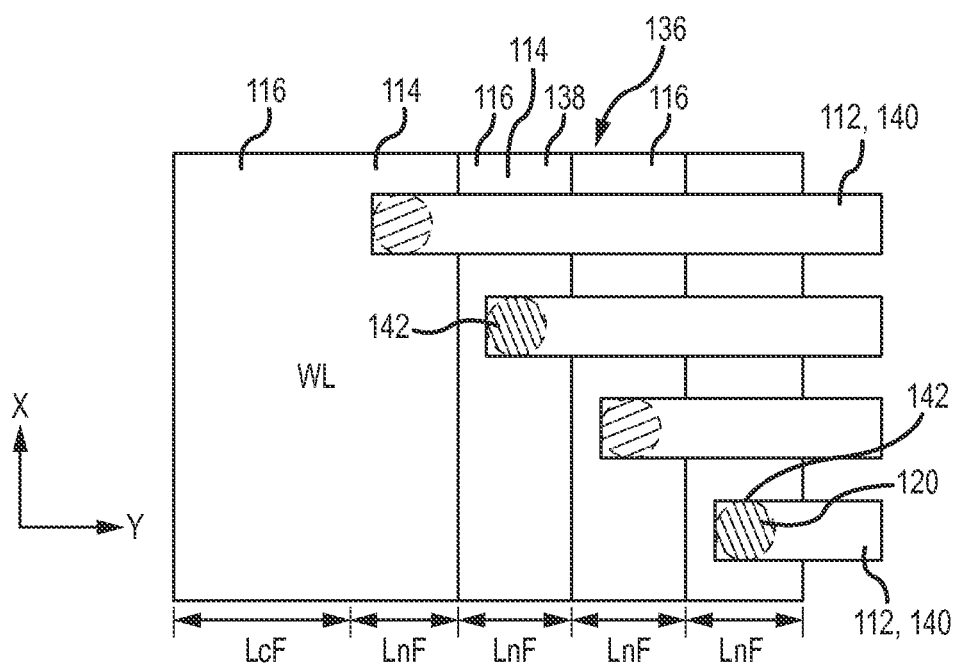
FIG. 4 depicts the prior art three dimensional memory structure of FIG. 3 in plan view.

FIG. 3 depicts a portion of an exemplary memory structure, such as the memory structure 100 illustrated in FIG. 1, encompassing a prior art word line socket region 136 in elevation, from a line of sight taken along the x dimension. FIG. 4 depicts the word line socket region 136 portion of the memory structure 100 shown in FIG. 3 in plan view, from a line of sight taken along the z axis or dimension. As illustrated, the word line socket region 136 can comprise a staircase type contact region. In addition, each contact 142 between a contact region 138 of a horizontal electrode 116 and a connecting conductor 120 is entirely disposed on a top surface 114 of the horizontal electrode 116. The length of the word line socket region 136 in a direction parallel to the y axis is proportional to the number of decks 116, and in this example configuration is given by the following expression: $L_s = \{L_c + L_n \, n\}F$, where $L_s$ is the socket length, $L_c$ is a constant length factor, $L_n$ is length factor dependent on the number of decks 116, n is the number of decks 116, and F is the half pitch of the memory cell area 128.

As shown in FIG. 3, each horizontal electrode 116 is separated from an adjacent horizontal electrode 116 by a dielectric or insulating layer 248. Each insulating layer 248 has an end surface 252 that is vertical (i.e. is orthogonal or at 90° to the top surface 114 of the horizontal electrode 116, and parallel to the z dimension) and that extends no further in a y direction than the horizontal electrode 116 directly above the insulating layer 248. Accordingly, a portion of the planar top surface 114 of each horizontal electrode 116 is available as a contact region 138 in which a contact 142 with a corresponding connecting conductor 120 can be formed. However, the alignment margin or spacing factor that must be maintained in the y dimension between adjacent connecting conductors 120, and more particularly between connecting conductors 120 electrically connected to a selected horizontal electrode 116 and the horizontal electrodes 116 on either side of the selected horizontal electrode 116, is relatively large, resulting in a spacing, given by LnF, that is correspondingly large.

Figure 5:
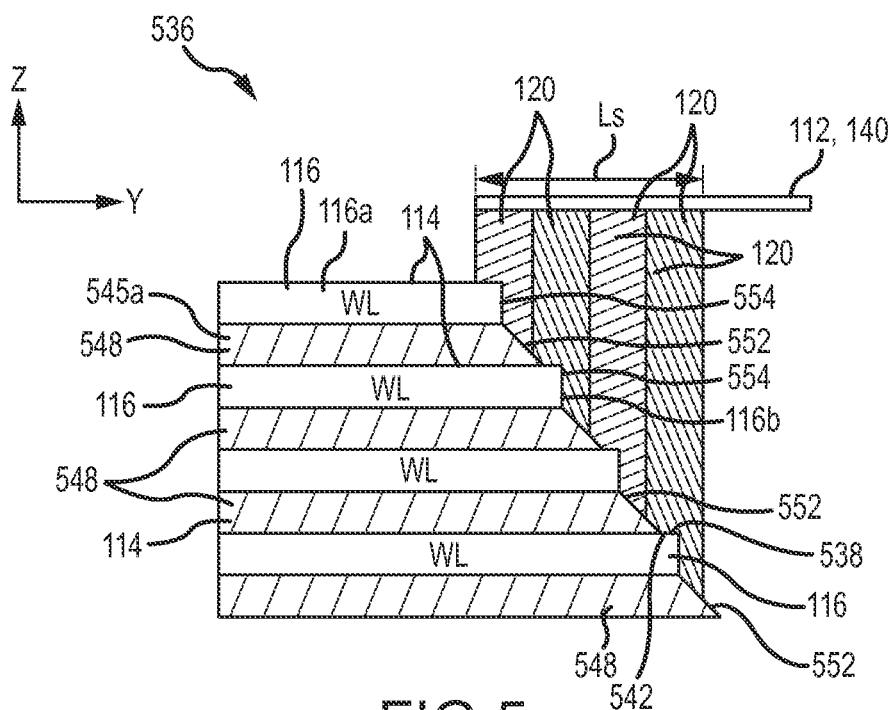
FIG. 5 depicts a three dimensional memory structure in accordance with embodiments of the present disclosure in elevation.
Figure 6:
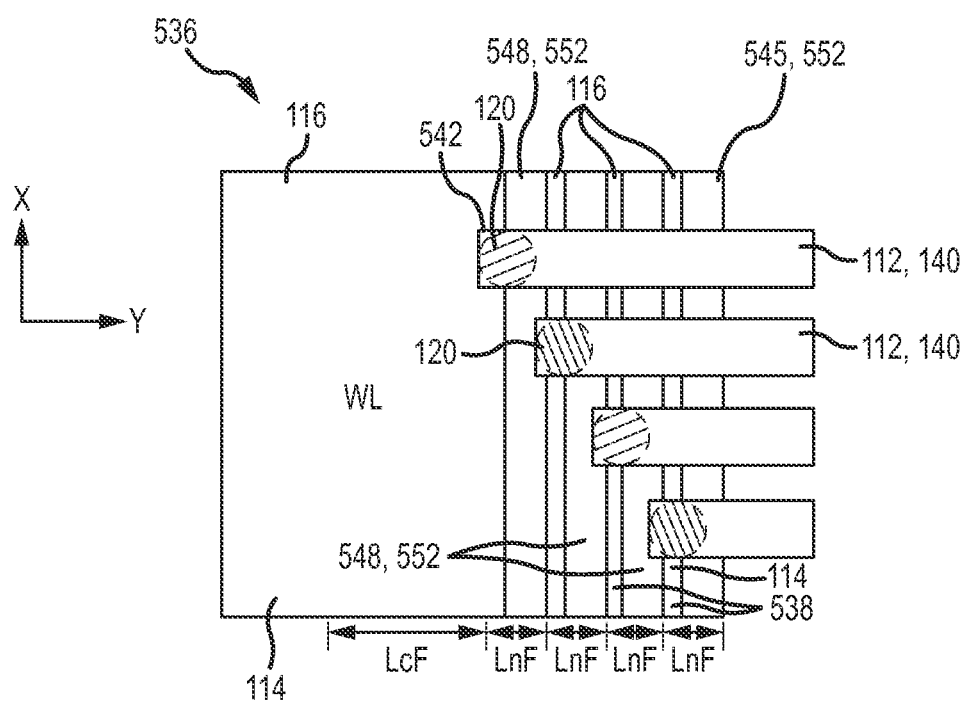
FIG. 6 depicts the three dimensional memory structure of FIG. 5 in plan view.

FIG. 5 depicts a portion of a three-dimensional memory structure, such as the memory structure 100 illustrated in FIG. 1, encompassing a word line socket region 536, configured in accordance with embodiments of the present disclosure in elevation, from a line of sight taken along the x axis. FIG. 6 depicts the word line socket region 536 portion of the memory structure 100 shown in FIG. 5 in plan view, from a line of sight taken along the z axis. The socket region 536 is similar to a conventional socket region 136 in that the ends of the planar electrodes 116 are disposed in a staircase type arrangement, in which the electrodes extend further in the y dimension the lower they are in the stack. In addition, each planar electrode 116 is separated from an adjacent electrode by an insulating or dielectric layer 548 interposed between the adjacent dielectric layers. As shown, the spacing between vertical or connecting conductors 120 has been reduced in the y direction. That is, the alignment margin or length factor has been decreased as compared to the prior art configuration illustrated in FIGS. 3 and 4. For example, while the conventional configuration required that a certain alignment margin be maintained between connecting conductors 120 in the y direction, embodiments of the present disclosure can be configured with a reduced alignment margin. In accordance with at least some embodiments of the present disclosure, the alignment margin can be zero. In accordance with still other embodiments, the alignment margin can be negative, such that the connecting conductors 120 overlap with one another in the y dimension, so long as they are separated from one another in the x dimension. The result is that embodiments of the present disclosure allow the spacing between the centerlines of the vertical conductors 120 to be reduced as compared to the spacing between vertical conductors 120 according to the prior art. Accordingly, for a given number of decks 116, and all other factors being equal, the length of a socket region 536 configured in accordance with embodiments of the present disclosure will be shorter than the socket length of a socket region 136 configured in accordance with the prior art. This reduced spacing is made possible by the tapered or sloped configuration of the edge surface 552 of the dielectric layers 548 between adjacent horizontal electrodes 116.

In accordance with embodiments of the present disclosure, the edge 552 corresponding to or including the farthest extent in the y dimension of a dielectric layer 548 (e.g., dielectric layer 548a) extends to a point between the furthest extent in the y dimension of the horizontal electrode 116 (e.g., horizontal electrodes 116a) directly above the dielectric layer 548 and the horizontal electrode 116 (e.g., horizontal electrode 116b) directly below the dielectric layer 548. In particular, a portion of the top surface 114 of the underlying horizontal electrode 116 between the edge surface 554 of the horizontal electrode 116a and the edge surface 554 of the overlying horizontal electrode 116 is partially covered by the dielectric layer 548. In addition, in this example the edge surface 552 of each dielectric layer 548 is sloped, such that it extends from a point corresponding to an end of a bottom surface of a horizontal electrode 116 that overlies the dielectric layer 548 to a point that is towards, but not as far as, the edge surface 554 of the underlying horizontal electrode 116. Accordingly, an uncovered portion 538 of the top surface 114 of the underlying horizontal electrode 116 that is available as a contact area 542 is reduced as compared to a configuration in which the edge of the dielectric layer is vertical. Said another way, in embodiments of the present disclosure an area of the top surface 114 of an underlying horizontal electrode 116 that is not overlapped by an overlaying horizontal electrode 116 is partially covered by the sloped end portion 552 of the intervening dielectric layer 548. As a result of this configuration, alignment tolerances, and thus an alignment margin requirement, is reduced as compared to the conventional configuration, or is eliminated entirely. In particular, a vertical conductor 120 that is misaligned will be prevented from contacting the horizontal electrode 116 directly below a target horizontal electrode 116 by the dielectric layer 548 underlying the target horizontal electrode 116. That is, over at least some range, the effect of a misaligned vertical conductor 120 can be obviated. As a result of the reduced alignment margin requirements thus made available, for a given spacing factor and number of decks 116, the length of the socket region $L_s$ of embodiments of the present invention is reduced as compared to a conventional arrangement having vertical dielectric layer edges.

In addition, an edge portion 554 of the target horizontal electrode 116 is available as a portion of the contact area 542. Therefore, electrical performance, including but not limited to a suitably low electrical resistance, between a horizontal electrode 116 and an associated vertical conductor 120 can be maintained, even if the area of the uncovered portion of the top surface 538 is reduced as compared to conventional configurations. In accordance with at least some embodiments, the vertical conductor is sized and aligned such that it contacts a portion of a dielectric layer 548 on either side of a target horizontal electrode 116.

Figure 7:
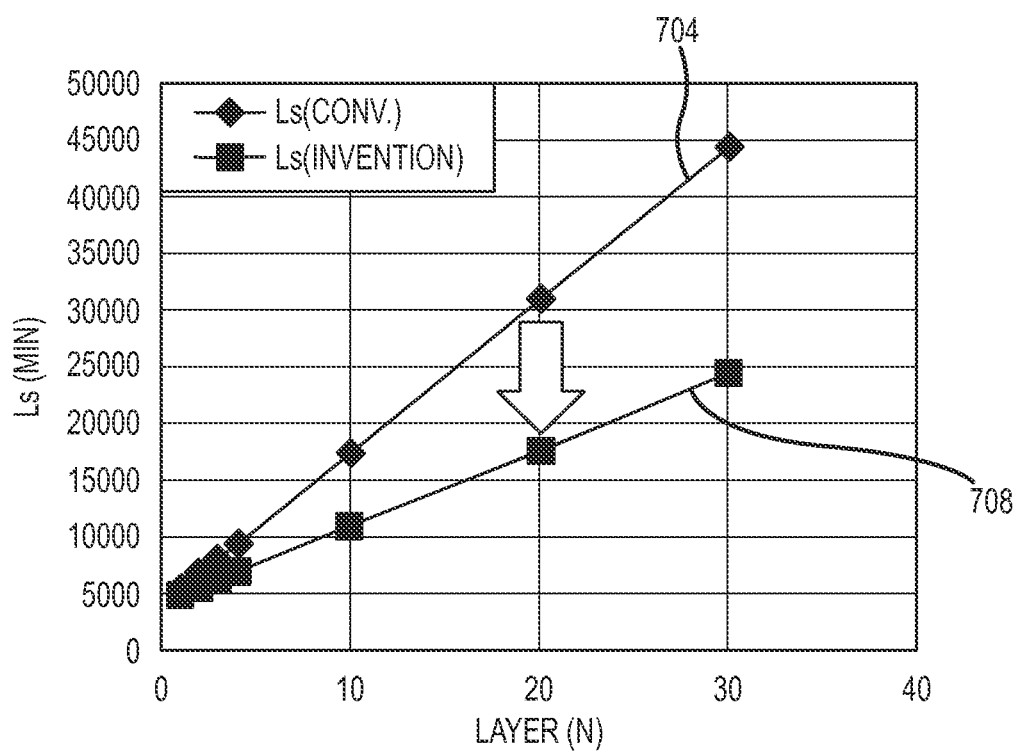
FIG. 7 is a graph depicting the area efficiency of an example three-dimensional memory structure in accordance with embodiments of the present invention as compared to the area efficiency of a reference three-dimensional memory structure.

FIG. 7 is a graph comparing the length of a word line socket region 136 configured according to conventional techniques (plot 704) to the length of a word line socket region 536 configured in accordance with embodiments of the present disclosure (plot 708). More particularly, the length ($L_s$) of the word line socket regions 136, 536 for three-dimensional memory structures having differing numbers of layers 116 are depicted. In this example, for a given constant length factor, and a given half pitch of cell area, it can be seen that the length of a word line socket region 536 constructed in accordance with embodiments of the present disclosure increases with the number of decks (n) at a rate that is less than the rate that the length of the word line socket region 136 constructed in accordance with conventional techniques increases. Accordingly, a reduction in size of a memory structure can be achieved.

Moreover, the area efficiency of a three-dimensional memory structure utilizing a word line socket region 536 configured in accordance with embodiments of the present disclosure can be greater than that of a conventional arrangement. In particular, the area efficiency of a three-dimensional memory structure can be evaluated as the ratio of the area of the memory array to the area of the memory array plus the area of the socket regions. More particularly, the area efficiency can be expressed as follows:

$$Eff = \frac{A_c}{(A_c + A_{first\_socket\_region} + A_{second\_socket\_region})} = \frac{A_c}{(A_c + A_s)}$$

where Eff is the area efficiency of the memory structure, $A_c$ is the area of the memory cell area, $A_{first\_socket\_region}$ is the area of the first socket region, $A_{second\_socket\_region}$ is the area of the second socket region, and $A_s$ is the total area of the bit line and word line socket regions. For example, with reference to FIG. 2, the area efficiency is equal to the area of the memory array area 128 divided by the area equal to the memory array area 128 plus the area of the bit line socket region 132 plus the area of the word line socket region 136, 536 where all of the areas are in a plane that is generally parallel to the horizontal electrodes or decks 116. Accordingly, where a socket region encompasses a staircase contact region, the area of that socket region is given by the projection of the region onto a horizontal plane. By providing a word line socket region 536 with dielectric layers 548 having sloped edges 552 as illustrated in FIGS. 5 and 6, the area efficiency of the resulting three-dimensional memory structure 500 of embodiments of the present disclosure can be improved as compared to conventional configurations.

Figure 8:
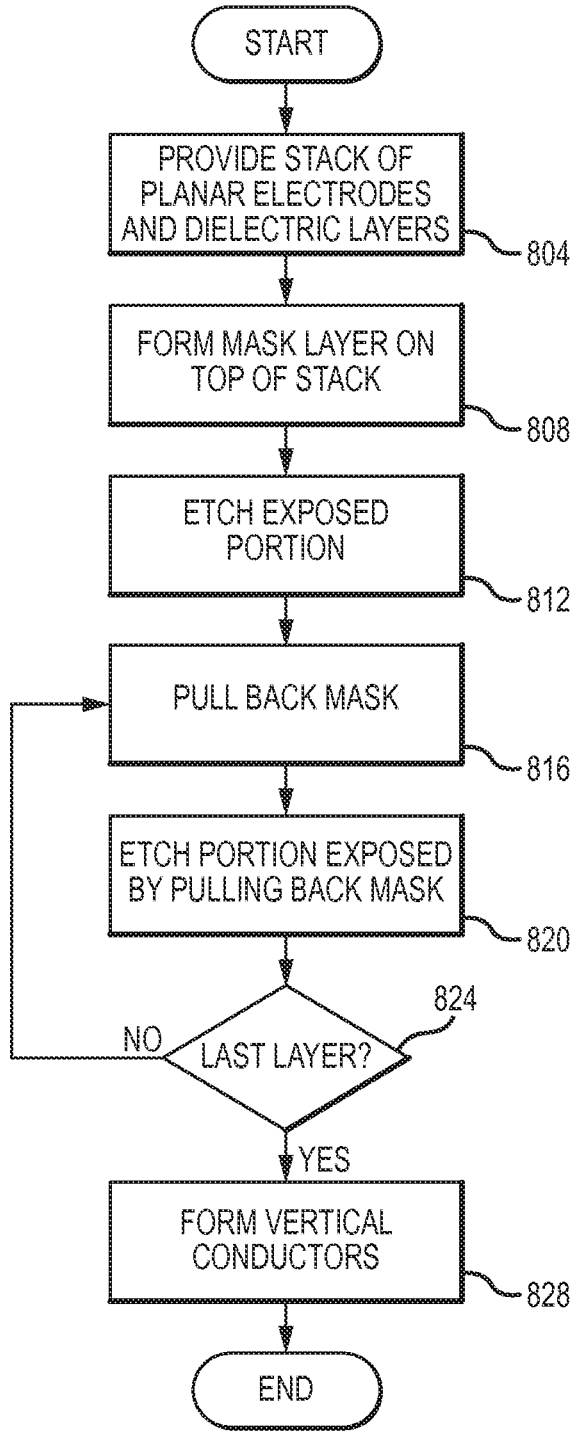
FIG. 8 is a flowchart depicting aspects of a method in accordance with embodiments of the present disclosure.
Figure 9A:
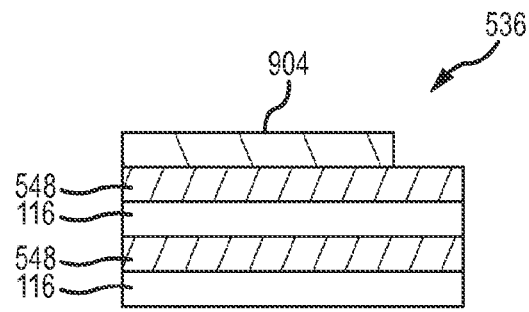
FIGS. 9A-9D depict steps of a process for forming a staircase contact structure in accordance with embodiments of the present disclosure.
Figure 9B:
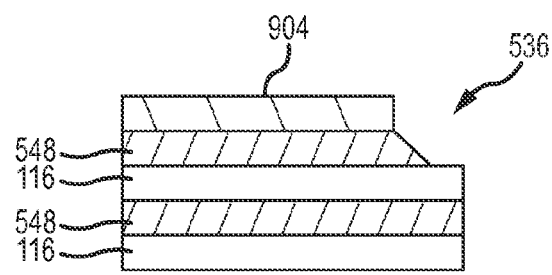
Figure 9C:
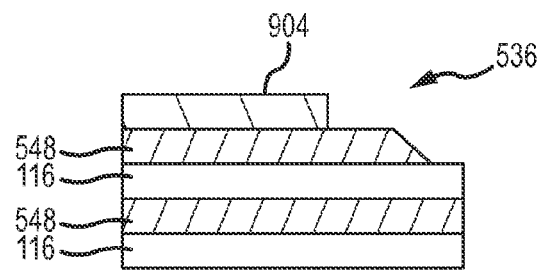
Figure 9D:
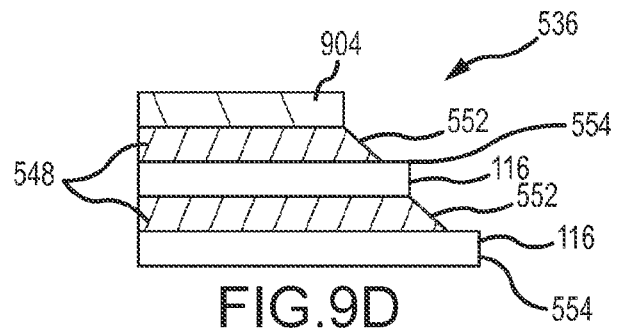

In accordance with embodiments of the present disclosure, a method for providing a socket region within a reduced area as compared to conventional techniques or configurations is provided. FIG. 8 presents a flowchart illustrating process steps of such a method, and the socket structure 536 at different stages during performance of the process steps is illustrated in elevation in FIGS. 9A-9D. The method can include providing a stack of planar or horizontal electrodes 116, with each planar electrode 116 separated from a neighboring planar electrode 116 by a dielectric layer 548 (step 804). A mask layer can then be formed over a top dielectric layer 548, such that the mask leaves a portion of the underlying dielectric layer uncovered (step 808). FIG. 9A illustrates the socket region 536 after the addition of the mask 904. The exposed portion of the dielectric layer 548 can then be etched (step 812). The socket region 536 after the initial step of etching is depicted in FIG. 9B. The mask 904 can then be pulled back (step 816). The socket region 536 after pulling back the mask 904 is depicted in FIG. 9C. Next, the planar electrode 116 exposed in the previous etching step, and a next dielectric layer 548, can be etched, while the upper dielectric layer 548 can be further etched (step 820). The socket region 536 after completion of step 820 is shown in FIG. 9D. This pullback process can be continued until a portion of the last planar electrode 116 is exposed. In accordance with embodiments of the present disclosure, during the etching process, the dielectric layers 548 are tapered, to create a sloped surface, rather than etched at a right angle to a top surface of an underlying planar electrode 116. Alternatively, the amount by which a dielectric layer 548 is "pulled back" can be less than the amount by which the overlying planar electrode 116 is "pulled back". At step 824, a determination can be made as to whether the last planar electrode 116 has been reached. If not, the process may return to step 816.

After the last electrode has been reached, vertical or connecting conductors 120 can be formed, such that at least one vertical conductor 120 is connected to each planar electrode 116 (step 828). During the step of forming the vertical conductors 120, the contact area 552 between a planar electrode 116 and an associated vertical conductor 120 encompasses portions of a top surface 114 of the horizontal electrode 116 as well as a portion of the edge surface 554 of the planar electrode 116. As can be appreciated by one of skill in the art after consideration of the present disclosure, the provision of dielectric layers 548 having sloped edges 532 prevents a vertical conductor 120 from electrically contacting a planar electrode 116 below a target planar electrode 116. Therefore, the alignment margin required for a given manufacturing tolerance can be reduced as compared to a conventional staircase type contact configuration. After electrically connecting each planar electrode 116 to a vertical conductor 120, the process can end.

Although embodiments of the present disclosure have discussed a socket region configuration that can occupy a reduced area as compared to conventional socket region arrangements in connection with a three-dimensional memory structure, embodiments of the present disclosure are not limited to use in connection with such structures. In particularly, a socket region as disclosed herein can be utilized in connection with any electrical structure in which contacts are disposed in a staircase type arrangement. More particularly, embodiments of the present disclosure provide a configuration in which an alignment margin can be reduced with respect to electrical contacts disposed in a staircase type arrangement.

Various features and components of embodiments of the present disclosure are for convenience described in connection with "vertical" and "horizontal" reference directions. In general, "vertical" refers to a dimension parallel to the z axis of a reference coordinate system depicted in various figures. The "horizontal" dimension generally corresponds to a plane lying in the x and y dimensions of the reference coordinate system. The absolute orientation of the coordinate system, and thus of "vertical" and "horizontal" components or features is not necessarily fixed. Thus, in accordance with embodiments of the present disclosure, the orientation of the coordinate system is not fixed within an absolute frame of reference.

The foregoing discussion of the invention has been presented for purposes of illustration and description. Further, the description is not intended to limit the invention to the form disclosed herein. Consequently, variations and modifications commensurate with the above teachings, within the skill or knowledge of the relevant art, are within the scope of the present invention. The embodiments described hereinabove are further intended to explain the best mode presently known of practicing the invention and to enable others skilled in the art to utilize the invention in such or in other embodiments and with various modifications required by the particular application or use of the invention. It is intended that the appended claims be construed to include alternative embodiments to the extent permitted by the prior art.

What is claimed is:

1. A method for forming a staircase contact socket region, comprising:
    providing a stack that includes a plurality of planar electrodes and a plurality of insulating layers, wherein adjacent planar electrodes are separated from one another by an insulating layer;
    placing a mask on the stack;
    etching a first portion of a first insulating layer included in the plurality of insulating layers not under the mask to expose a first portion of a first planar electrode included in the plurality of planar electrodes;
    pulling back the mask;
    after pulling back the mask, etching a second portion of the first insulating layer exposed by pulling back the mask, etching a part of the first portion of the first planar electrode and etching a first portion of a second insulating layer included in the plurality of insulating layers, wherein an edge of the second insulating layer formed by the etching is sloped and extends from an edge of the first planar electrode to between the edge of the first planar electrode and an edge of a second planar electrode included in the plurality of planar electrodes.

2. The method of claim 1, wherein an edge of the first insulating layer is sloped.

3. The method of claim 2, wherein the edges of the first and second planar electrodes are vertical.

4. The method of claim 3, further comprising:
    forming a plurality of connecting conductors, wherein each connecting conductor is electrically connected to a top surface and an edge surface of one of the planar electrodes.

* * * * *